(12) United States Patent
Nomaguchi et al.

(10) Patent No.: US 11,817,289 B2
(45) Date of Patent: *Nov. 14, 2023

(54) CHARGED PARTICLE BEAM DEVICE

(71) Applicants: HITACHI HIGH-TECH CORPORATION, Tokyo (JP); Japan Fine Ceramics Center, Nagoya (JP)

(72) Inventors: Tsunenori Nomaguchi, Tokyo (JP); Shunichi Motomura, Tokyo (JP); Tadahiro Kawasaki, Nagoya (JP); Takeharu Kato, Nagoya (JP); Ryuji Yoshida, Nagoya (JP)

(73) Assignees: Hitachi High-Tech Corporation, Tokyo (JP); Japan Fine Ceramics Center, Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/725,276

(22) Filed: Apr. 20, 2022

(65) Prior Publication Data

US 2022/0246385 A1 Aug. 4, 2022

Related U.S. Application Data

(63) Continuation of application No. 17/043,560, filed as application No. PCT/JP2018/013397 on Mar. 29, 2018, now Pat. No. 11,335,532.

(51) Int. Cl.
*H01J 37/09* (2006.01)
*H01J 37/10* (2006.01)
(Continued)

(52) U.S. Cl.
CPC .............. *H01J 37/09* (2013.01); *H01J 37/10* (2013.01); *H01J 37/153* (2013.01);
(Continued)

(58) Field of Classification Search
CPC .......... H01J 37/09; H01J 37/10; H01J 37/153; H01J 37/244; H01J 2237/0458; H01J 2237/1534
See application file for complete search history.

(56) References Cited

U.S. PATENT DOCUMENTS 11,335,532 B2 * 5/2022 Nomaguchi ............ H01J 37/09
2006/0289804 A1 12/2006 Knippelmeyer
(Continued)

FOREIGN PATENT DOCUMENTS

| JP | 51-17454 U | 2/1976 |
| JP | 59-66849 U | 5/1984 |

(Continued)

OTHER PUBLICATIONS

International Search Report (PCT/ISA/210) issued in PCT Application No. PCT/JP2018/013397 dated Jun. 26, 2018 with English translation (four (4) pages).
(Continued)

*Primary Examiner* — Nicole M Ippolito
*Assistant Examiner* — Hanway Chang
(74) *Attorney, Agent, or Firm* — Crowell & Moring LLP

(57) ABSTRACT

As a device for correcting positive spherical aberration of an electromagnetic lens for a charged particle beam, a spherical aberration correction device combining a hole electrode and a ring electrode is known. In this spherical aberration correction device, when a voltage is applied between the hole electrode and the ring electrode, the focus of the charged particle beam device changes due to the convex lens effect generated in the hole electrode. Therefore, in a charged particle beam device including a charged particle beam source which generates a charged particle beam, a charged particle beam aperture having a ring shape, and a charged particle beam aperture power supply which applies
(Continued)

a voltage to the charged particle beam aperture, the charged particle beam aperture power supply is configured to apply, to the charged particle beam aperture, a voltage having a polarity opposite to a polarity of charges of the charged particle beam.

14 Claims, 6 Drawing Sheets

(51) Int. Cl.
  *H01J 37/153* (2006.01)
  *H01J 37/244* (2006.01)
(52) U.S. Cl.
  CPC ..... *H01J 37/244* (2013.01); *H01J 2237/0458* (2013.01); *H01J 2237/1534* (2013.01)

(56) References Cited

U.S. PATENT DOCUMENTS

2018/0014670 A1  1/2018  Chen
2018/0116391 A1  5/2018  Decker et al.

FOREIGN PATENT DOCUMENTS

| JP | 4-248236 A | 9/1992 |
| JP | 2005-303165 A | 10/2005 |
| JP | 2008-204675 A | 9/2008 |
| JP | 2012-227160 A | 11/2012 |
| WO | WO 2016/174891 A1 | 11/2016 |

OTHER PUBLICATIONS

Japanese-language Written Opinion (PCT/ISA/237) issued in PCT Application No. PCT/JP2018/013397 dated Jun. 26, 2018 (six (6) pages).

Japanese-language Office Action issued in Japanese Application No. 2020-508735 dated Apr. 20, 2021 with English translation (eight (8) pages).

German-language Office Action issued in German Application No. 11 2018 007 212.6 dated Apr. 28, 2023 with English translation (11 pages).

Van Aken, R.H. et al., "Design of an aberration corrected low-voltage SEM", Ultramicroscopy 110, 2010, pp. 1411-1419 (9 pages).

\* cited by examiner

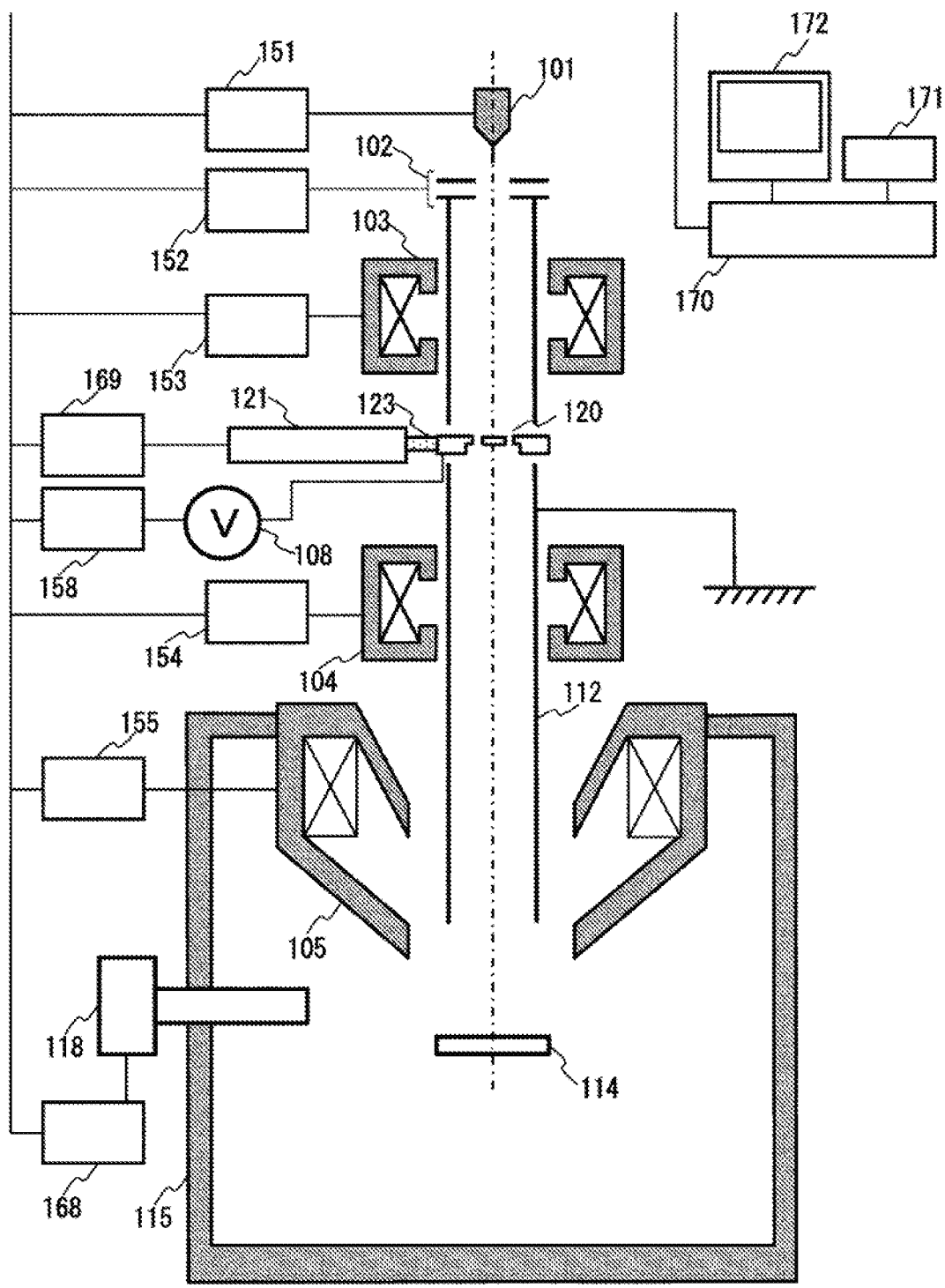
[FIG. 1]

FIG. 2A
TOP VIEW
FIG. 2B
CROSS-SECTIONAL VIEW
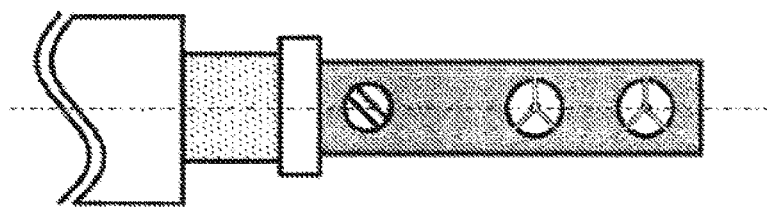
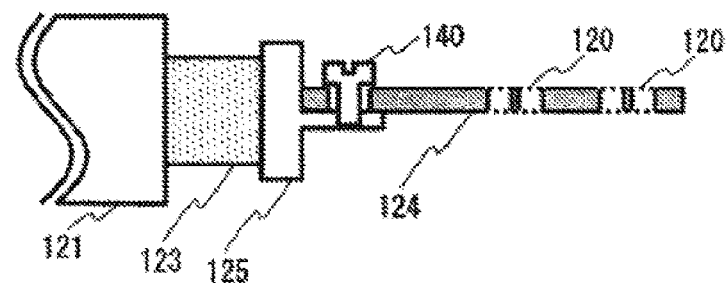
FIG. 2C
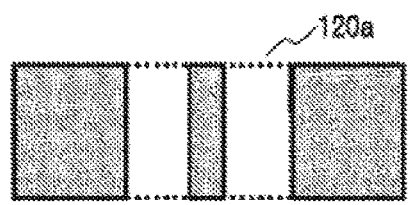
FIG. 2D
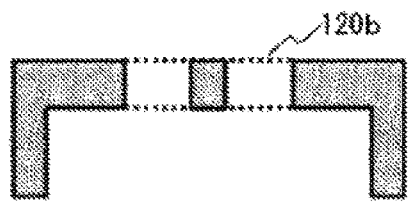
FIG. 2E
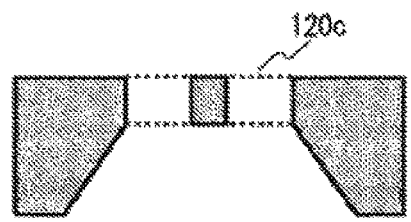

TOP VIEW

CROSS-SECTIONAL VIEW

FIG. 4A
TOP VIEW
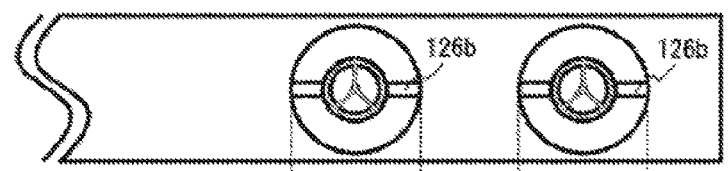
FIG. 4B
CROSS-SECTIONAL VIEW
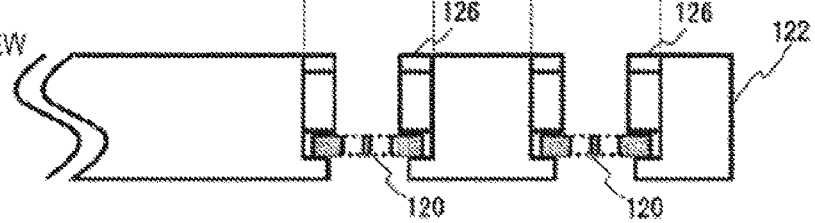
[FIG. 5]
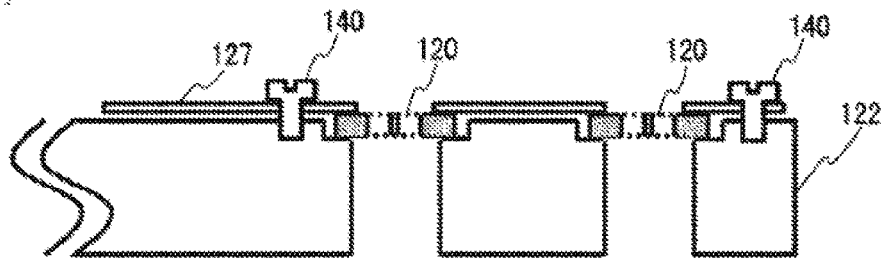
[FIG. 6]
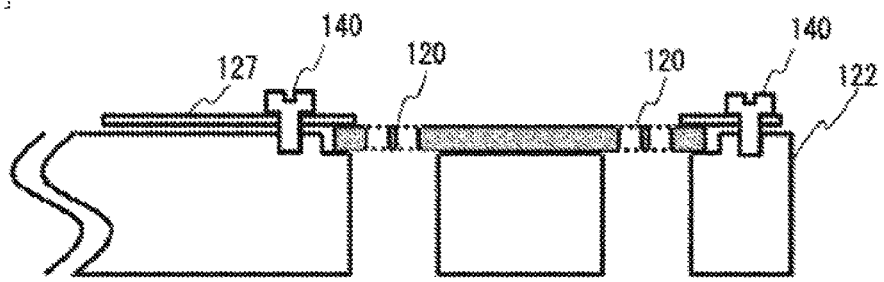

[FIG. 7]
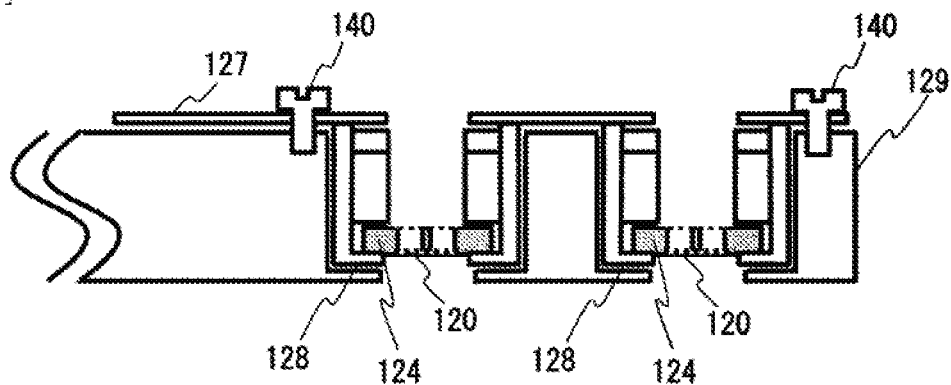
[FIG. 8]
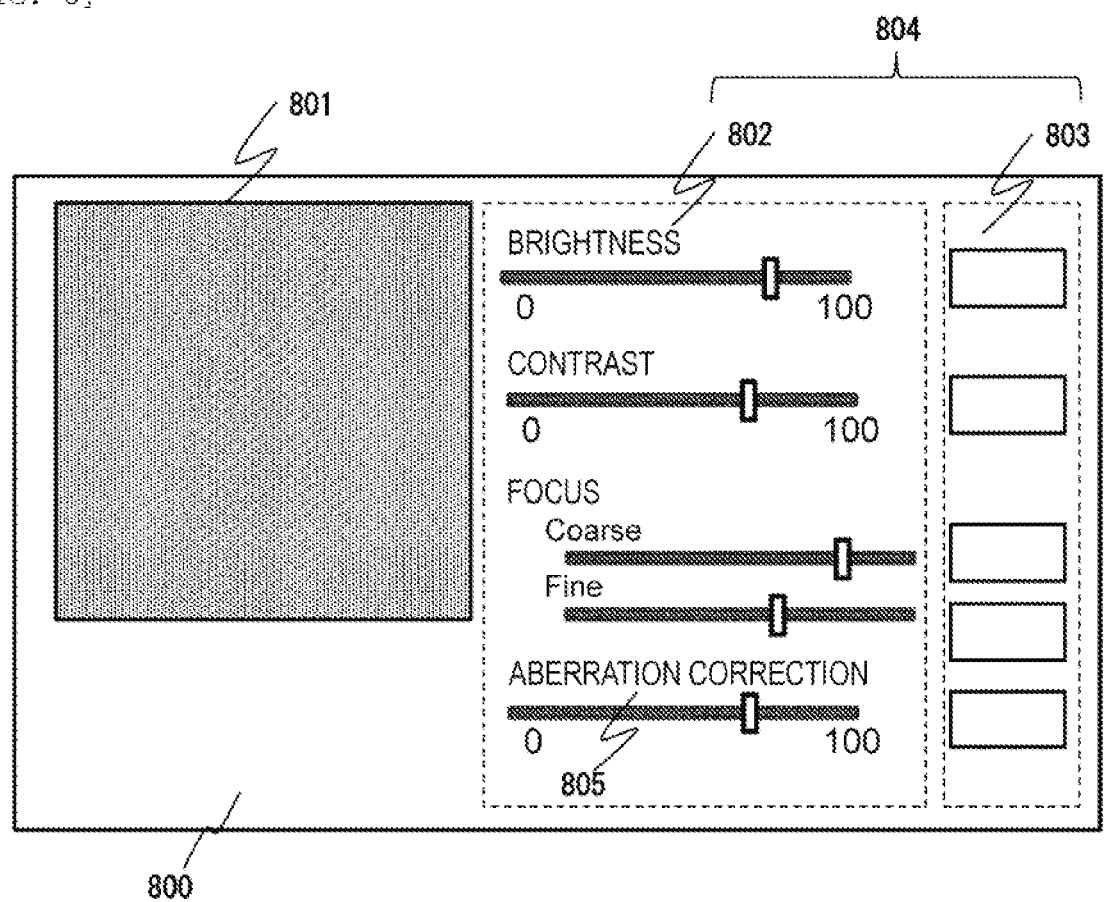

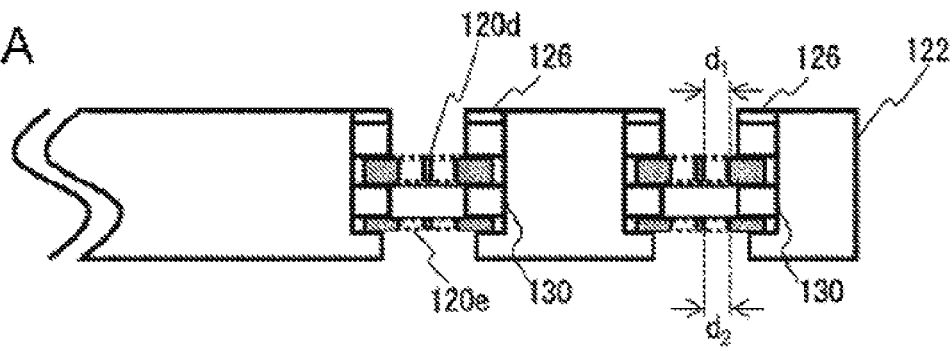
FIG. 9A
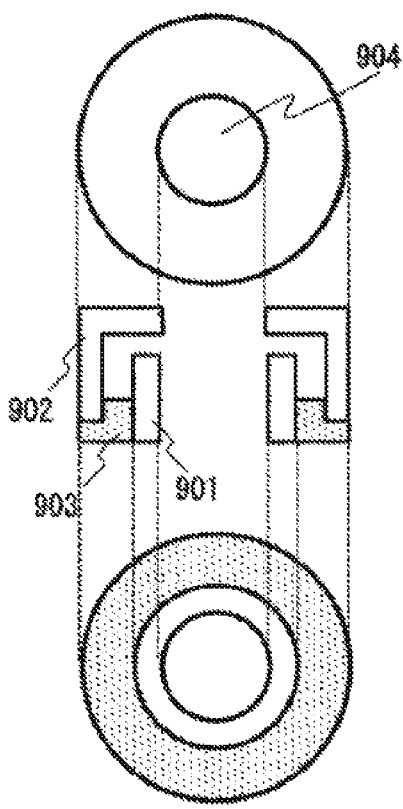
FIG. 9B  TOP VIEW
FIG. 9C  CROSS-SECTIONAL VIEW
FIG. 9D  BOTTOM VIEW

CHARGED PARTICLE BEAM DEVICE

CROSS-REFERENCE

This application is a continuation of U.S. patent application Ser. No. 17/043,560 filed Sep. 29, 2020, which is a 371 of International Application No. PCT/JP2018/013397, filed Mar. 29, 2018, the disclosures of which are expressly incorporated by reference herein.

TECHNICAL FIELD

The present invention relates to a charged particle beam device that irradiates a sample with a charged particle beam.

BACKGROUND ART

A charged particle beam device such as a scanning electron microscope (SEM) or a focused ion beam system (FIB) focuses a charged particle beam on a sample to perform nano-level observation, analysis, and processing. These charged particle beam devices are widely used in the fields of semiconductors, materials, and biotechnology, which require nano-level observation, analysis, and processing. Further, in various fields including the semiconductor field in which miniaturization is progressing, further improvement in image resolution and processing accuracy is required.

PTL 1 discloses a spherical aberration corrector that can be realized with a simple structure in which an incident plate and an emission plate are provided, one thereof has a circular opening, and the other has an annular opening, and applying a voltage between the incident plate and the emission plate leads to divergence for eliminating positive spherical aberration by an electric field formed in the annular opening.

CITATION LIST

Patent Literature

PTL 1: International Publication No. WO 2016/174891

SUMMARY OF INVENTION

Technical Problem

In the spherical aberration corrector disclosed in PTL 1, when a voltage is applied between a hole electrode (refers to a plate provided with a circular opening) and a ring electrode (refers to a plate provided with an annular opening), a convex lens effect occurs in the hole electrode, and the focus of the charged particle beam changes. Further, in order to make the hole electrode and the ring electrode have different potentials from each other, it is necessary to interpose an insulating sheet between the hole electrode and the ring electrode. When the insulating material is charged up, a desired voltage cannot be applied between the hole electrode and the ring electrode, and the aberration correction performance may be deteriorated.

Solution to Problem

A charged particle beam device according to one embodiment includes a charged particle beam source which generates a charged particle beam; a charged particle beam aperture having a ring shape; and a charged particle beam aperture power supply which applies a voltage to the charged particle beam aperture, in which the charged particle beam aperture power supply is configured to apply, to the charged particle beam aperture, a voltage having a polarity opposite to a polarity of charges of the charged particle beam.

Other problems and novel features will become apparent from the description of this specification and the accompanying drawings.

Advantageous Effects of Invention

A spherical aberration correction effect can be obtained while suppressing a focus change occurring when a voltage is applied to the charged particle beam aperture.

BRIEF DESCRIPTION OF DRAWINGS

FIG. 1 is a schematic view of a charged particle beam device.

FIGS. 2A and 2B are schematic diagrams showing a configuration of a charged particle beam aperture portion.

FIG. 2C is a sectional view of a charged particle beam aperture.

FIG. 2D is a sectional view of a charged particle beam aperture.

FIG. 2E is a sectional view of a charged particle beam aperture.

FIGS. 4A and 4B are schematic diagrams showing a configuration of a support structure for the charged particle beam aperture.

FIG. 5 is a schematic diagram showing a configuration of a support structure for the charged particle beam aperture.

FIG. 6 is a schematic diagram showing a configuration of a support structure for the charged particle beam aperture.

FIG. 7 is a schematic diagram showing a configuration of a support structure for the charged particle beam aperture.

FIG. 8 is an example of a GUI screen.

FIG. 9A is a schematic view showing the structure of a charged particle beam aperture using two ring-shaped apertures.

FIGS. 9B to 9D are examples of a spacer in a case where two ring-shaped apertures are insulated.

DESCRIPTION OF EMBODIMENTS

Figures 3A, 3B:
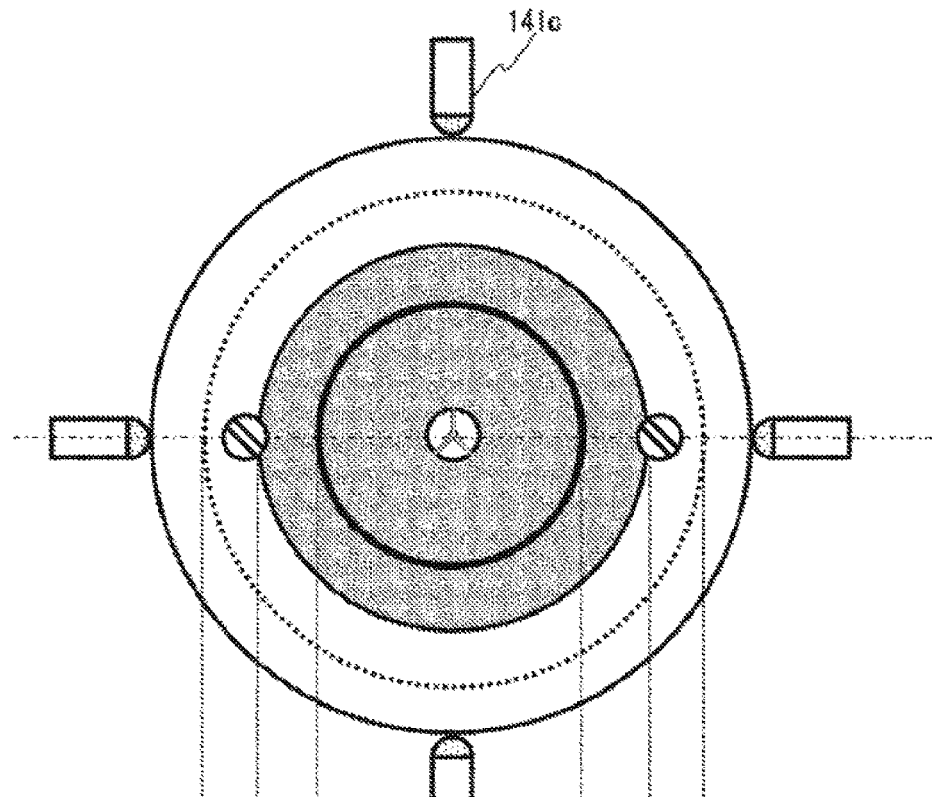
FIGS. 3A and 3B are schematic diagrams showing a configuration of a charged particle beam aperture portion.

When an equipotential line bends in the vicinity of the annular opening, the aberration correction effect of the aberration corrector of PTL 1 is achieved. The inventors of the present application have conducted intensive studies to improve the resolution of the charged particle beam device, and as a result, it has been found that the aberration correction effect can be obtained by eliminating the hole electrode and applying a predetermined voltage to the ring-shaped charged particle beam aperture. As described above, the presence of the hole electrode causes a focus shift of the charged particle beam. However, it has been found that an aberration correction effect can be obtained, when a relatively stable electric field environment is formed inside a lens barrel constituting a charged particle optical system, the charged particle beam aperture has a ring shape, and even without a hole electrode, a predetermined voltage is applied to the ring-shaped charged particle beam aperture. Here, it is considered that the function of the hole electrode is to stably generate equipotential lines in the vicinity of the annular opening, and it is necessary to apply a higher voltage than in the case where the hole electrode is provided. When charged particle beams are electrons, a positive voltage having a polarity opposite to the negative charge of the electron may be applied, and when charged particle beams are positive ion, a negative voltage having a polarity opposite to the positive charge of the positive ion may be applied to a ring-shaped charged particle beam aperture.

An embodiment of the present invention will be described with reference to the drawings. The present embodiment is only an example for realizing the present invention. In each drawing, the same reference numerals are given to the same components.

FIG. 1 schematically illustrates a charged particle beam device. A charged particle beam device includes, as main elements, a charged particle beam source 101 for generating a charged particle beam, an acceleration electrode 102 for accelerating the charged particle beam emitted from the charged particle beam source 101, a beam tube 112 disposed near the lower end of an objective lens 105 from the acceleration electrode 102, a first and second condenser lenses 103, 104 for focusing charged particle beams emitted from the charged particle beam source, a charged particle beam aperture 120 having a ring shape for shielding a portion of charged particles emitted from the charged particle beam source 101, an insulating material 123 for electrically insulating the charged particle beam aperture 120, a charged particle beam aperture device 121 including a series of parts necessary for moving the charged particle beam aperture, such as the charged particle beam aperture 120, a support member for supporting the charged particle beam aperture, and a driving mechanism, a charged particle beam aperture power supply 108 for applying a voltage to the charged particle beam aperture 120, an objective lens 105 for focusing charged particle beam to the sample 114, a sample chamber for disposing the sample 114, and a detector 118 for detecting secondary charged particles emitted from the sample 114. Further, examples of a controller for controlling each component of the above-described charged particle optical system include a charged particle beam source controller 151 for controlling the charged particle beam source 101, an acceleration electrode controller 152 for controlling the acceleration electrode 102, and first and second condenser lens controllers 153 and 154 for controlling the first and second condenser lenses 103 and 104, a charged particle beam aperture controller 169 for controlling the charged particle beam aperture device 121, a charged particle beam aperture power supply controller 158 for controlling the charged particle beam aperture power supply 108, an objective lens controller 155 for controlling the objective lens 105, and a detector controller 168 for controlling the detector 118. These controllers are controlled by an integrated computer 170 that controls the operation of the entire charged particle beam device and constructs a charged particle beam image from the secondary charged particle beams detected by the detector 118. The integrated computer 170 is connected to a controller (a keyboard, a mouse, or the like) 171 and a display 172. The operator inputs various instructions such as irradiation conditions, voltage conditions of the charged particle beam aperture and position conditions from the controller 171, and the acquired image and the control screen can be displayed on the display 172. In addition, the charged particle beam device has a configuration such as a deflection system for scanning and shifting the charged particle beam, but is omitted in FIG. 1.

In the example of FIG. 1, two condenser lenses 103 and 104 are provided, but the number of condenser lenses is not limited for the purpose of controlling charged particles incident on the objective lens 105. The objective lens 105 is provided with a lens that does not leak a magnetic field outside the magnetic path, but may be a lens that leaks a magnetic field outside the magnetic path, or a compound objective lens having both a type that leaks a magnetic field and a type that does not leak a magnetic field. In addition, the condenser lenses 103 and 104 and the objective lens 105 may be an electrostatic lens for the above-described purpose, or may be an objective lens using both a magnetic lens and an electrostatic lens like a booster optical system or a retarding optical system. There is no limitation on the type of lens for the purpose of focusing the charged particle beam on the sample 114.

In FIG. 1, the beam tube 112 is set to a GND potential (reference potential), but a predetermined voltage is applied to the booster optical system. For the purpose of covering the path of the charged particle beam, the shape and the number of constituent members are not limited. Further, the detector 118 that detects the secondary charged particles may be disposed in the sample chamber 115 as illustrated in FIG. 1, or may be disposed in a column on which the charged particle optical system is mounted. Further, the detector 118 may be disposed both in the sample chamber 115 and the inside of the column. For the purpose of detecting the secondary charged particles, the number of the detectors 118 and the location thereof are not limited. Although FIG. 1 illustrates a charged particle beam device including one charged particle beam column, a composite charged particle beam device including a plurality of charged particle beam columns may be used.

FIG. 2A illustrates the configuration of the charged particle beam aperture. A top view is illustrated in (a), and a cross-sectional view is illustrated in (b). In the example of FIG. 2A, the charged particle beam aperture 120 is formed directly on the charged particle beam aperture plate 124, and a voltage is applied to the charged particle beam aperture plate 124 from the charged particle beam aperture power supply 108. The charged particle beam aperture plate 124 is attached to a charged particle beam aperture plate support 125 by screws 140, and the charged particle beam aperture plate support 125 is supported by an insulating material 123. The present invention is not limited thereto, and the charged particle beam aperture plate 124 and the charged particle beam aperture plate support 125 may be integrally formed. In addition, since a voltage is applied to the charged particle beam aperture plate 124, the potential can be separated from surrounding structures by the insulating material 123. For that purpose, a high-resistance conductive member may be used instead of an insulating material. In addition, one or a plurality of charged particle beam apertures 120 are disposed on the charged particle beam aperture plate 124. When a plurality of apertures are disposed, there is an advantage that even if one aperture is contaminated or damaged, observation and processing can be resumed immediately by switching to another aperture. Further, the shapes of the plurality of charged particle beam apertures 120 may not be the same. In this case, there is an advantage that a charged particle beam aperture suitable for different observation conditions and processing conditions such as acceleration voltage can be selectively used.

FIGS. 2B to 2D illustrate sectional views of the charged particle beam aperture. The charged particle beam aperture 120a has the same ring shape from the upper side (the charged particle beam source side) to the lower side (the objective lens side) of the plate on which the aperture is formed (FIG. 2B). On the other hand, in the charged particle beam apertures 120b and 120c, the upper side of the plate has an ring shape, and the lower side of the plate, which is the back side, has a cylindrical shape having a larger diameter than the ring shape (120b in FIG. 2C) or a conical shape (120c in FIG. 2D) whose diameter gradually increases from a ring shape. A part of the charged particle beams passing through the charged particle beam aperture 120 collides with the side wall of the charged particle beam aperture, and generates secondary charged particles (electrons). For example, in a case where the charged particle beam device is an electron microscope, when the secondary electrons generated on the side wall of the charged particle beam aperture reach the sample, it has the same effect as when the electron beam irradiating the sample spreads, which may cause deterioration of observation performance. Therefore, especially when the charged particle beam source 101 is an electron source, the shapes illustrated in FIGS. 2C and 2D which can reduce the collision with the side wall of the charged particle beam aperture 120 is more preferable than the shape illustrated in FIG. 2B. However, since the spherical aberration correction effect by the charged particle beam aperture 120 is provided by the electric field formed in the annular portion of the aperture, the thickness of the annular portion is not to be significantly thin, and from the viewpoint of the strength of the annular portion, it is also desirable that the annular portion is thick to some extent. For these reasons, the thickness of the annular portion is desirably 1 m or more. Note that the thickness of the charged particle beam aperture plate 124 is about 10 m or more. As a method of forming the aperture 120 on the aperture plate 124, molding by pressing with a mold, molding by etching, molding by FIB, or the like may be used.

Since charged particles colliding with the insulating material 123 causes charge-up, it is desirable that the insulating material 123 is in a position that cannot be seen from the path of the charged particle beam such that the insulating material 123 is not irradiated with at least charged particle beams generated from the charged particle beam source 101. As an example, as illustrated in FIG. 1, when the insulating material 123 is disposed outside the beam tube 112, a structure that cannot be seen from the path of the charged particle beam can be easily realized.

Further, in FIG. 2A, the charged particle beam aperture 120 is formed in a rectangular plate, but as illustrated in FIG. 3, the aperture plate 124 has a disk shape, and the charged particle beam aperture 120 may be supported on a disk-shaped support 125 by screws 140. In this example, position adjusting members 141a to 141d are provided for the support 125 in order to adjust the optical axis of the aperture 120. Further, the insulating material 123 supporting the disk-shaped support 125 may have a cylindrical shape as illustrated in the drawing, or may include a plurality of blocks. Thereby, the potential of the aperture and the potential of the surrounding structure can be separated. Also in this case, it is desirable that the insulating material 123 has a structure that cannot be seen from the path of the charged particle beam, so the insulating material 123 is disposed outside the beam tube 112. Also in this case, it is desirable that the shape of the charged particle beam aperture 120 is as illustrated in FIGS. 2C and 2D.

Hereinafter, a modification example of the support structure of the charged particle beam aperture 120 will be described. FIG. 4 illustrates a support structure for fixing the charged particle beam aperture 120 (irrespective of the shape of a plate on which the aperture is formed, such as a circle or a rectangle) to a charged particle beam aperture support 122. A top view is illustrated in (a), and a cross-sectional view is illustrated in (b). In this example, the charged particle beam aperture 120 is placed in the recess of the charged particle beam aperture support 122, and is held down by the pressure screw 126 with a thread on the side from above. The recess is formed by, for example, counterbore processing on the support 122. Further, in the illustrated example, the screw portion is on the upper side (on the charged particle beam source side), but the screw portion may be on the lower side (on the objective lens side). The groove 126b of the pressure screw 126 is provided for screwing the pressure screw 126 into the support 122.

A modification example of the support structure of the type illustrated in FIG. 4 will be described. Since the top view is almost the same as the top view of FIG. 4, only the cross-sectional views are illustrated. In FIGS. 5 and 6, the charged particle beam aperture 120 is placed on the charged particle beam aperture support 122, and is screwed using a screw 140 through a pressure plate 127. FIG. 5 illustrates an example in which one charged particle beam aperture is formed on one plate, and FIG. 6 illustrates an example in which a plurality of charged particle beam apertures are formed on one aperture plate. In the present configuration, the method of directly or indirectly fixing the charged particle beam aperture using a screw has been described. However, the fixing member other than the screw may be used as the pressure member. However, since the charged particle beam aperture 120 is a consumable product, it is desirable that the aperture is easily detachable from the support.

FIG. 7 illustrates a configuration in which the charged particle beam aperture unit 128 is fixed to the charged particle beam aperture unit support base 129. If the outer diameter of the charged particle beam aperture unit 128 and the inner diameter of the support of the charged particle beam aperture unit support 129 are fitted to each other, and the position of the charged particle beam aperture in the charged particle beam aperture unit 128 is accurately controlled, the displacement of the charged particle beam aperture caused by the attachment/detachment or exchange can be suppressed. Also in the structure in FIG. 7, for easy attachment and detachment, the charged particle beam aperture unit 128 is fixed to the charged particle beam aperture unit support 129 by a pressure plate 127 coupled to the charged particle beam aperture unit support 129 by screws 140. As a method of accurately controlling the position of the charged particle beam aperture 120 in the charged particle beam aperture unit 128, a method of assembling the charged particle beam aperture unit 128 and thereafter, processing the charged particle beam aperture 120 in the center of the charged particle beam aperture 120 by using FIB or the like is considered. Also in the structures in FIGS. 4 to 7, in order to separate the potentials of the charged particle beam aperture 120 and the charged particle beam aperture support base 122 from the potentials of the surrounding structures, it is necessary to be supported by the charged particle beam aperture device 121 through an insulating material. This can be realized with a configuration similar to that of FIG. 2A.

The above-described support structure has a configuration in which all members to which a voltage is applied are exposed, but some of the members may be covered with a member having a GND (reference potential) of the charged particle beam device.

When the charged particle beam aperture 120 having a ring shape is used, a lens generated by applying a voltage to the charged particle beam aperture 120 is a concave lens generated at an annular opening. Using this concave lens, the positive spherical aberration of a convex lens such as an objective lens is corrected. Therefore, if the focus adjustment is performed before the voltage is applied to the charged particle beam aperture 120, the focus blur hardly occurs after the voltage is applied to the charged particle beam aperture 120. This is very advantageous when searching for a voltage to be applied to the charged particle beam aperture 120 in order to obtain an appropriate aberration correction effect. If focus blurring occurs by applying a voltage to the charged particle beam aperture 120, each time the voltage to be applied to the charged particle beam aperture 120 is changed, improvement in image quality cannot be confirmed unless focus adjustment is performed. That is, it is necessary to repeatedly perform the adjustment of the voltage to be applied to the charged particle beam aperture 120 and the adjustment of the focus. However, in the present example, since focus blur does not occur, the image quality can be improved in real time while changing the voltage to be applied to the charged particle beam aperture 120.

FIG. 8 illustrates an example of a GUI screen for adjusting the aberration correction amount displayed on the display 172. The GUI screen 800 is provided with a live screen 801 for displaying a charged particle beam image and a control screen 804 for controlling the image quality while viewing the image quality of the live screen 801. In FIG. 8, the control screen 804 is provided with a slide bar 802 for adjusting the size of each parameter and a numerical value input field 803 for directly inputting the numerical value of each parameter. "Aberration correction" 805 is provided as one of the parameters. By controlling this value, the voltage to be applied to the charged particle beam aperture 120 is controlled, and the aberration correction amount can be adjusted. In addition to the adjustment using the GUI screen 800, it is also possible to provide a control switch such as a knob on the controller 171 (operation console) to adjust the voltage to be applied to the voltage at which the highest image quality is achieved.

As described above, the operability can be greatly improved by eliminating hole electrodes and applying a voltage to the charged particle beam aperture 120 having a ring shape to realize spherical aberration correction.

FIG. 9A illustrates a structure of an aperture portion using two charged particle beam apertures having a ring shape disposed along the optical axis direction of the charged particle beam. In this charged particle beam aperture, a voltage is applied to the charged particle beam aperture power supply with respect to the upper (charged particle beam source side) charged particle beam aperture 120$d$. This configuration is the same as the other configurations in that the above-described aberration correction effect can be obtained. Further, in this configuration, most of the secondary charged particles generated on the side wall with respect to the upper (charged particle beam source side) charged particle beam aperture 120$d$ are shielded by the lower (objective lens side) charged particle beam aperture 120$e$. This can suppress deterioration of the observation performance due to the secondary charged particles. In this illustrated example, the thickness of the lower annular aperture 120$e$ is smaller than the thickness of the upper annular aperture 120$d$. This is because the upper annular aperture 120$d$ realizes a spherical aberration correction effect, and the lower annular aperture 120$e$ mainly aims to suppress secondary charged particles reaching the sample as much as possible. As described above, it is preferable to provide a difference in the thickness of the aperture, but a certain effect can be expected even when the same upper and lower annular apertures are used. Further, from the viewpoint of suppressing secondary charged particles reaching the sample, the opening width d2 of the lower annular aperture 120$e$ may be smaller than the opening width d1 of the upper annular aperture 120$d$. Further, in the drawing, the two charged particle beam apertures 120$d$ and 120$e$ are in contact with each other via the conductive spacer 130 and are electrically connected, but may be electrically independent. When a voltage is applied only to the upper charged particle beam aperture 120$d$ and no voltage is applied to the lower charged particle beam aperture 120$e$, the role of each charged particle beam aperture becomes clear. However, when the two annular apertures are electrically independent, it is desirable that the insulating material be invisible from the path of the charged particle beam. FIG. 9B illustrates (a) a top view, (b) a cross-sectional view, and (c) a bottom view of the spacer in consideration of the arrangement of the insulating material. In this example, the spacer 900 has an inner spacer 901 and an outer spacer 902 having a larger diameter than the inner spacer 901, and the inner spacer 901 and the outer spacer 902 are connected via an insulating material 903. Since the charged particle beam passes through the opening 904 of the spacer 900, the insulating material 903 can be disposed at a position invisible from the path of the charged particle beam.

REFERENCE SIGNS LIST

101: Charged particle beam source
102: Acceleration electrode
103: First condenser lens
104: Second condenser lens
105: Objective lens
108: Charged particle beam aperture power supply
112: Beam tube
114: Sample
115: Sample chamber
118: Detector
120: Charged particle beam aperture having ring shape
121: Charged particle beam aperture device
122: Charged particle beam aperture support
123: Insulating material
124: Charged particle beam aperture plate
125: Charged particle beam aperture plate support
126: Pressure screw
127: Pressure plate
128: Charged particle beam aperture unit
129: Charged particle beam aperture unit support
123: First deflector group
124: Second deflector group
125: Third deflector group
126: Transmission pattern detection surface
127: Camera
128: Optical lens
129: Pressure screw
130: Insulation material
131: Insulating spacer
132: Spacer
133: Pressing plate
151: Charged particle source controller
152: Accelerator electrode controller
153: First condenser lens controller
154: Second condenser lens controller
155: Objective lens controller
158: Charged particle beam aperture power controller
163: First deflector group controller
164: Second deflector group controller 165: Third deflector group controller
167: Camera controller
168: Detector controller
169: Charged particle beam aperture controller
170: Integrated computer
171: Controller
172: Display

The invention claimed is:

1. A charged particle beam device comprising:
a charged particle beam source that generates a charged particle beam;
a charged particle beam aperture having a ring shape; and
a charged particle beam aperture power supply that applies a voltage to the charged particle beam aperture,
wherein the charged particle beam aperture power supply applies, to the charged particle beam aperture, a voltage having a polarity opposite to a polarity of charges of the charged particle beam.

2. The charged particle beam device according to claim 1, further comprising:
a charged particle optical system that focuses the charged particle beam to the sample,
wherein the charged particle optical system includes the charged particle beam source and the charged particle beam aperture, and
wherein the charged particle beam aperture is provided in an electric field environment formed in the charged particle optical system.

3. The charged particle beam device according to claim 1, further comprising:
a charged particle beam aperture plate in which the charged particle beam aperture is formed, and to which a voltage is applied by the charged particle beam aperture power supply; and
an insulating material that separates a potential of the charged particle beam aperture plate from a potential of surrounding structures,
wherein the insulating material is disposed at a position that is not visible from a path of the charged particle beam.

4. The charged particle beam device according to claim 3, wherein a plurality of the charged particle beam apertures are formed on the charged particle beam aperture plate.

5. The charged particle beam device according to claim 1, further comprising:
a charged particle beam aperture support having a recess, in which the charged particle beam aperture being fixed to the recess by a pressure member; and
an insulating material that separates a potential of the charged particle beam aperture support from a potential of surrounding structures,
wherein the insulating material is disposed at a position that is not visible from a path of the charged particle beam.

6. The charged particle beam device according to claim 5, wherein the pressure member fixes the charged particle beam aperture to the charged particle beam aperture support by a screw, or fixes the charged particle beam aperture to the charged particle beam aperture support through a pressure plate.

7. The charged particle beam device according to claim 1, further comprising:
a charged particle beam aperture unit to which the charged particle beam aperture is fixed;
a charged particle beam aperture support having a recess, the outer diameter of the charged particle beam aperture unit and the inner diameter of the recess being fitted to each other;
a pressure member that fixes the charged particle beam aperture unit to the charged particle beam aperture support; and
an insulating material that separates a potential of the charged particle beam aperture support from a potential of surrounding structures,
wherein the insulating material is disposed at a position that is not visible from a path of the charged particle beam.

8. A charged particle beam device comprising:
a charged particle beam source that generates a charged particle beam;
a first charged particle beam aperture having a ring shape;
a second charged particle beam aperture that is disposed in the optical axis direction of the charged particle beam with respect to the first charged particle beam aperture and has a ring shape; and
a charged particle beam aperture power supply that applies a voltage having a polarity opposite to a polarity of charges of the charged particle beam to the first charged particle beam aperture,
wherein the first charged particle beam aperture is disposed closer to the charged particle beam source than the second charged particle beam aperture.

9. The charged particle beam device according to claim 8, further comprising:
a charged particle optical system that focuses the charged particle beam to the sample,
wherein the charged particle optical system includes the charged particle beam source, the first charged particle beam aperture and the second charged particle beam aperture, and
wherein the first charged particle beam aperture and the second charged particle beam aperture are provided in an electric field environment formed in the charged particle optical system.

10. The charged particle beam device according to claim 8, wherein an opening width of the second charged particle beam aperture is smaller than an opening width of the first charged particle beam aperture.

11. The charged particle beam device according to claim 8, wherein the first charged particle beam aperture and the second charged particle beam aperture are electrically independent,
wherein a spacer provided between the first charged particle beam aperture and the second charged particle beam aperture includes a first spacer in contact with the first charged particle beam aperture, a second spacer in contact with the second charged particle beam aperture, an insulating material interposed between the first spacer and the second spacer, and
wherein the insulating material is disposed at a position that is not visible from a path of the charged particle beam.

12. A charged particle beam device comprising:
a charged particle beam source that generates a charged particle beam;
a charged particle beam aperture having a ring shape;
a charged particle beam aperture power supply that applies a voltage having a polarity opposite to a polarity of charges of the charged particle beam;

an objective lens that focuses the charged particle beam and irradiates a sample with the charged particle beam;

a detector that detects secondary charged particles emitted by irradiating the sample with the charged particle beam;

a computer that forms a charged particle beam image based on the secondary charged particles detected by the detector; and a display connected to the computer, wherein a voltage applied from the charged particle beam aperture power supply to the charged particle beam aperture is controlled by a slide bar on an operation screen of a GUI screen displayed on the display or a control switch of a controller connected to the computer.

13. The charged particle beam device according to claim 12, further comprising:

a charged particle optical system that focuses the charged particle beam to the sample, wherein the charged particle optical system includes the charged particle beam source and the charged particle beam aperture, and wherein the charged particle beam aperture is provided in an electric field environment formed in the charged particle optical system.

14. The charged particle beam device according to claim 13, wherein the display has a live screen for displaying the charged particle beam image.

* * * * *